(12) United States Patent
Stoddard et al.

(10) Patent No.: US 10,355,152 B2
(45) Date of Patent: Jul. 16, 2019

(54) FLEXIBLE LAMINATES FOR SOLAR MODULES

(71) Applicant: Sunpower Corporation, San Jose, CA (US)

(72) Inventors: Nathan Stoddard, Beaverton, OR (US); Mukesh Dulani, Portland, OR (US)

(73) Assignee: Sunpower Corporation, San Jose, CA (US)

( * ) Notice: Subject to any disclaimer, the term of this patent is extended or adjusted under 35 U.S.C. 154(b) by 351 days.

(21) Appl. No.: 14/976,256

(22) Filed: Dec. 21, 2015

(65) Prior Publication Data

US 2017/0179318 A1 Jun. 22, 2017

(51) Int. Cl.
| | |
|---|---|
| *H01L 31/05* | (2014.01) |
| *H02S 20/00* | (2014.01) |
| *H02S 20/23* | (2014.01) |
| *H02S 30/00* | (2014.01) |
| *H01L 31/048* | (2014.01) |
| *H02S 40/32* | (2014.01) |
| *H02S 40/36* | (2014.01) |

(52) U.S. Cl.
CPC ........ *H01L 31/048* (2013.01); *H01L 31/0508* (2013.01); *H02S 20/00* (2013.01); *H02S 20/23* (2014.12); *H02S 30/00* (2013.01); *H02S 40/32* (2014.12); *H02S 40/36* (2014.12); *Y02B 10/12* (2013.01); *Y02E 10/50* (2013.01)

(58) Field of Classification Search
None
See application file for complete search history.

(56) References Cited

U.S. PATENT DOCUMENTS

2009/0133733 A1* 5/2009 Retti .................. H01M 10/465
136/206
2011/0056559 A1* 3/2011 Sahlin ................ H01L 31/0481
136/259

* cited by examiner

*Primary Examiner* — Shannon M Gardner
(74) *Attorney, Agent, or Firm* — Xsensus, LLP

(57) ABSTRACT

A solar module includes a laminate structure having at least two solar cells. Each of the solar cells has an individual reinforcement laminated to one face of each of the solar cells. The solar cells are spaced apart from each other and the individual reinforcements are spaced apart from each other such that a gap is defined between each of the solar cells. The solar module includes flexible conductors that extend through the gap between the solar cells and electrically connect the solar cells to each other.

12 Claims, 6 Drawing Sheets

FLEXIBLE LAMINATES FOR SOLAR MODULES

TECHNICAL FIELD

The present disclosure relates generally to solar modules, and, in particular, to laminates for solar modules.

BACKGROUND

Solar modules typically include a solar panel having a laminate structure. The laminate structure includes an active layer formed by a plurality of interconnected solar cells which are responsible for converting light into electricity. The active layer is sandwiched between two thin layers of transparent material, such as ethylene vinyl acetate (EVA). Due to the thin and fragile nature of the laminate structure, relatively little stress is needed to bend the solar cell laminate. Bending of the cells can cause cracks in the laminate structure of the cells that can degrade the performance of the solar module.

To help prevent bending and deflecting of the solar cells, glass sheets are often placed on the front side and back side of the laminate structure. Glass is used because it is stiff, inexpensive, waterproof, and resistant to impacts. The laminate structure with the front side and back side glass sheets is typically mounted to a frame which surrounds the laminate structure and stiffens the laminate structure and the glass sheets against bending. This configuration does a decent job of limiting the mechanical stress on the solar cells which can result from a bending force being applied to the solar module.

However, large sheets of glass which are attached to an outer frame structure are still capable of bending to a certain degree. Even a relatively small pressure in the center of the glass sheet can produce sufficient deflection to cause cracks in the laminate structure of the solar cells. This bending occurs because the moment of the pressure is relatively large due to the distance from the support points at the edges of the glass.

What is needed is a laminate structure for a solar module that enables the laminate structure to bend or deflect without cracking or otherwise damaging the solar cells.

SUMMARY

According to one embodiment, a solar module includes a laminate structure having at least two solar cells. Each of the solar cells has an individual reinforcement laminated to one face of each of the solar cells. The solar cells are spaced apart from each other and the individual reinforcements are spaced apart from each other such that a gap is defined between each of the solar cells. The solar module includes flexible conductors that extend through the gap between the solar cells and electrically connect the solar cells to each other. The solar module may include a transparent cover layer, or top sheet, that covers all of the solar cells and is attached to an outer face of each of the individual reinforcements of the solar cells. The solar module may also include a back side sheet that covers all of the solar cells and is attached to a back face of the laminate structure.

The individual reinforcement is formed of a strong, rigid material, such as hard plastic or glass. The individual reinforcement may be laminated to a back face and/or to a front face of the solar cell. The flexible conductors comprise metal, ribbon-type electrical conductors or multi-wire electrical conductors. The solar module includes a module connection interface for connecting the solar module. The module connection interface includes at least two terminal interconnections. In some embodiments, electronic devices, such as DC/AC micro inverters, DC/DC converters, and DC/DC optimizers may be incorporated into the laminate structure. A DC/AC micro inverter, a DC/DC converter, and/or a DC/DC optimizer can be secured to the back face of the laminate structure, e.g., by adhesives.

The solar module may have a frame or may comprise a frameless module. If the solar module is a frameless module, the solar module includes a mounting system that enables the solar module to be attached to a mounting surface, such as a roof. The solar module has one or more anchor points at which the solar module is secured to the mounting system. The mounting system may comprise one or more stand offs secured to the solar module at the one or more anchor points and that are arranged between the solar module and the mounting surface. The stand offs may comprise pucks, rails, tubes, or similar types of structures. The solar module may define a peripheral region of the laminate structure outside of the solar collecting region of the solar module that can be used to connect the solar module to the mounting surface and to the peripheral edge of another solar module. The peripheral region can be configured to a mounting surface using at least one of nails, threaded hardware, staples, glue and adhesives (such as tar roof adhesives). In one embodiment, the peripheral region defines a plurality of openings for receiving screws for securing the solar module to a mounting surface. The solar module may include grommets built in to the laminate structure that defines the plurality of openings in the peripheral region.

In another embodiment, a solar module comprises a plurality of solar cells arranged in an array. The array includes at least two columns. Each of the columns has at least two solar cells. Each of the columns includes a column reinforcement extending over each of the solar cells in the column and that is laminated to one face of each of the solar cells in the column. The column reinforcement of each of the columns is spaced apart from any adjacent column reinforcements such that a gap is defined between each of the columns. The solar module includes flexible conductors that extend through the gap between the columns and electrically connect the solar cells to each other. In one embodiment, the column reinforcement comprises a separate individual reinforcement for each of the solar cells which is laminated onto the one face of solar cell. The separate individual reinforcements may be spaced apart from each other. In this embodiment, the column reinforcement may include strips of material arranged in the laminate structure between the individual reinforcements in the column to limit flexing of the solar cells in the column with respect to each other.

In yet another embodiment, an assembly of solar modules comprises a plurality of interconnected solar modules. Each solar module includes a laminate structure having at least two solar cells. Each of the solar cells has an individual reinforcement laminated to one face of each of the solar cells. The solar cells are spaced apart from each other and the individual reinforcements are spaced apart from each other such that a gap is defined between each of the solar cells. The solar module includes flexible conductors that extend through the gap between the solar cells and electrically connect the solar cells to each other. Each solar module includes a module connection interface via which the solar modules are electrically connected in parallel to each other. In one embodiment, each of the solar modules outputs a given AC voltage depending at least in part on lighting conditions. The solar modules are connected such that an output current of the assembly is a function of a number of solar modules connected in parallel in the assembly. In another embodiment, each of the solar modules outputs a given DC current depending at least in part on lighting conditions. The solar modules are connected such that an output voltage of the assembly is a function of a number of solar modules connected in series in the assembly.

DETAILED DESCRIPTION

Figure 1:
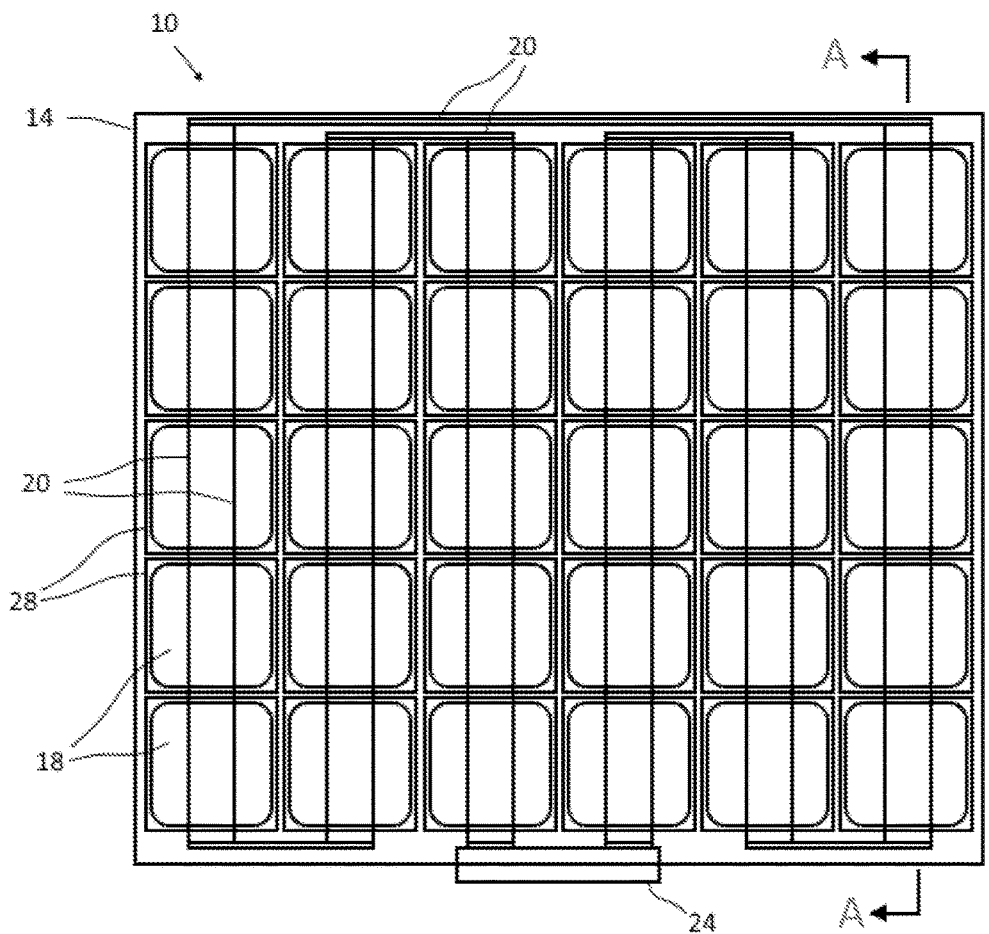
FIG. 1 is a schematic plan view of an embodiment of a solar module having individually reinforced solar cells in accordance with the present disclosure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to a person of ordinary skill in the art to which this disclosure pertains.

The present disclosure is directed to a laminate structure for a solar module that enables solar cells to be reinforced for better protection while allowing flexibility between the solar cells so that bending and deflecting of the solar module that can occur due to impacts, changing environmental conditions, mounting stresses, and the like are less likely to result in cracking and fractures of the solar cell laminate. To accomplish this goal, a solar cell laminate structure has been developed in which individual solar cells or small groups of solar cells are provided with their own reinforcements. The reinforcement comprises a layer of reinforcing material, such as hard plastic or glass, of suitable thickness and strength to substantially prevent the associated cell or group of cells from flexing or deflecting substantially under normal conditions. A back side sheet and possibly a front side sheet are then applied to laminate structure. The front side sheet is applied to the outer face of each of the reinforcements to cover all of the solar cells.

The reinforced solar cells are spaced apart from the other reinforced cells in the laminate structure which allows the gaps or joints between reinforced cells to have greater flexibility than the reinforced cells themselves. To facilitate this flexibility, the outer cover layers for the solar module can be configured to have greater flexibility than the reinforcements. For example, the outer cover layers can be formed of a more flexible material and/or have a layer thickness that allows the cover layer to flex to a desired degree. In addition, flexible conductors and connectors are used in the joints between reinforced cells to electrically connect the solar cells. Flexible conductors, such as ribbons or multi-wire conductors, can flex to a certain degree without breaking or being damaged and therefore can be arranged in the joints between reinforced cells without impacting the flexibility of the joints.

The use of individually reinforced cells and cell groups can reduce the cost of manufacturing solar modules. For example, large module-sized glass sheets for both covering and protecting the cells are no longer required. More flexible and less protective cover layers can be used if desired. In addition, the greater resistance to cracks and damage to the solar cells and the greater flexibility of the overall solar module that can result from the use of reinforced cells reduces the need for large module-sized glass sheets for both covering and protecting the cells as well as the need for external frames and reinforcement members which are used to support the laminate and the glass and to prevent deflecting of the laminate and the glass. By omitting traditional frames and module-sized protective glass, solar modules can be provided in sizes and shapes that would otherwise be too complex and/or expensive to implement reasonably. In addition, the installation process can be greatly simplified as well which can reduce the cost to the consumer as well. Furthermore the flexible interconnection of the reinforced cells or columns of cells provides the opportunity to mount such solar assemblies on slightly to moderate bended surfaces.

Figure 2:
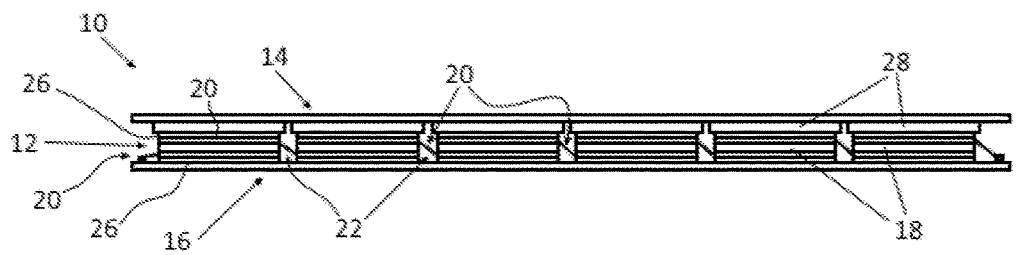
FIG. 2 is a cross-sectional view of the solar module of FIG. 1 taken along lines A-A.

Referring now to the drawings, a solar module 10 in accordance with the present disclosure is depicted in FIGS. 1 and 2. The solar module 10 has a laminate structure comprising a photoelectrically active layer 12 sandwiched between a front side cover layer 14 (typically glass) and a back side cover layer 16. The active layer 12 includes a plurality of solar cells 18. The solar cells 18 may be formed of any one of crystalline silicon, amorphous silicon, cadmium telluride, chalcopyrite or other suitable material.

As can be seen in FIG. 1, the solar cells 18 are arranged in an array having columns and rows. In FIG. 1, the array has six columns and six rows (6×6). In alternative embodiments, the solar cells may be arranged in different numbers of columns and rows. The solar cells 18 are electrically interconnected by a plurality of electrical conductors 20. The conductors 20 are electrically contacted with at least one face of each of the solar cells 18 and extend through the gaps 22 between cells 18 to electrically connect adjacent solar cells. The electrical conductors 20 may comprise any suitable kind of conductive material. As discussed below, the electrical conductors 20 may be provided in the form of ribbons, multi-wire conductors, or other type of flexible conductor, at least in the regions between cells. Referring to FIG. 1, the solar module 10 is equipped with an interconnection 24 interface that enables the solar module 10 to be electrically connected to external wiring, e.g., input and output wiring, and/or to other solar modules. The interconnection interface 24 comprises at least two terminals for connecting to the solar cell wiring.

Referring again to FIG. 2, one or both sides of the solar cells 18 may be provided with a thin, transparent layer 26 of plastic material, such as ethylene vinyl acetate (EVA), which can protect the solar cells against environmental influences. A back side cover layer 16 is attached to the back side of the laminate structure. The back side cover layer 16 may be formed of a transparent material, such as glass or plastic. In the embodiment of FIGS. 1 and 2, a front side cover layer 14 is attached to the front side. The front side cover layer 14 is formed of a transparent material, such as glass or plastic. In alternative embodiments, the front side glass may be omitted.

In accordance with the present disclosure, an individual reinforcement layer 28 is provided for each of the solar cells. As can be seen in FIG. 2, the reinforcement is positioned between the solar cells and the front side glass. The reinforcement 28 is sized so as to be substantially the same size as, or slightly larger than, a single solar cell 18. As can be seen in FIG. 1, the reinforcements only slightly overlap their corresponding solar cells. As discussed below, reinforcements 28 may be sized to correspond to portions of the solar cells of a solar module. For example, reinforcements may be provided on a per column basis in a solar module. In one embodiment, the reinforcement layer is formed of a hard plastic material although in some embodiments glass may be used.

A reinforcement 28 may be laminated onto one or both faces the solar cell 18. In the embodiment of FIGS. 1 and 2, the reinforcement 18 is laminated onto the front face of the solar cell. In alternative embodiments, a reinforcement may be laminated to the back face of the solar cells (not shown) as an alternative to or in addition to the reinforcement on the back face of the solar cell. The reinforcement 28 may be attached to a face of the solar cell in any suitable manner. In one embodiment, the reinforcement 28 is attached to the solar cell by an adhesive. The front side cover layer 14 is attached to an outer face of each of the reinforcements. In one embodiment, front side cover layer 14 is attached to the reinforcement 28 using an adhesive.

As can be seen in FIGS. 1 and 2, the edges of the reinforcements of adjacent solar cells are spaced apart from each other. This results in a gap 22 being defined between adjacent cells that extends between the front side glass 14 and the back side glass 16. These gap regions 22, also referred to herein as joints, have less material thickness. As a result, the joints 22 between solar cells 18 have greater flexibility than the reinforced solar cells. When the laminate flexes, it is the laminate material between the cells and the metal interconnects that flex, not the silicon of the solar cells. The smaller pieces of reinforcing material require much more pressure, applied much more locally, to break a cell. Thus, when mechanical stresses are applied to the solar module, the joint regions can bend to absorb the stress while the reinforced solar cells are allowed to remain flat and unbent.

In one embodiment, the cell-to-cell joints 22 of the solar module 10 are configured to enable adjacent solar cells to bend or deflect approximately 5 degrees with respect to each other although any suitable amount of deflection may be implemented. To facilitate greater flexibility in the joint regions relative to the reinforced cells, the front side sheet and the back side sheet may be formed of materials and/or may be dimensioned to provide a desired amount of flexibility. For example, the front side and back side cover layers 14, 16 could be replaced with a plastic material that is more flexible than the glass that is typically used. The solar cell wiring at least in the joint regions is also configured to have a certain level of flexibility so that the wiring in the joints does not break or transfer mechanical stresses between cells. As examples, the wiring conductors may be ribbon-type conductors, multi-wire conductors, or any other type of flexible conductor. The open spaces in the joints between cells may be left empty. Alternatively, the open spaces could be filed with a filler material. A filler material could be used to decrease the flexibility of and/or strengthen the joints if needed so long as the resulting joint flexibility was still greater than the flexibility of the reinforced solar cells. A filler material could also be used to limit the amount of bending of the wiring in the joints.

Figure 3:
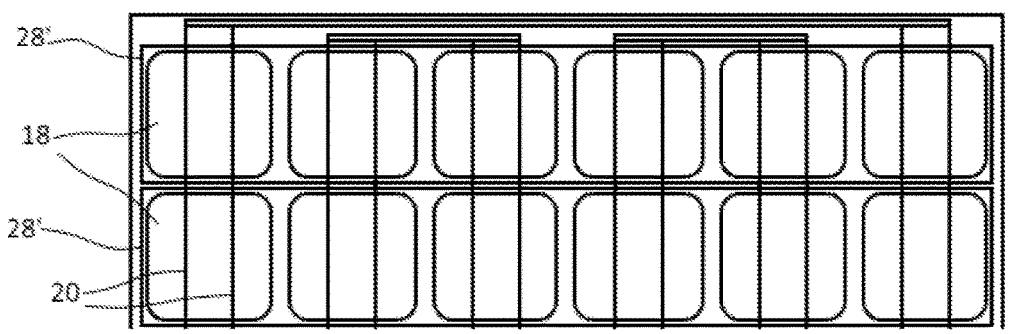
FIG. 3 is an alternate embodiment of a solar module in which reinforcements are provided for the solar cells on a per column basis.

In the embodiment of FIGS. 1 and 2, reinforcements 28 are provided for each individual solar cell 18 of the solar module. In alternative embodiments, reinforcements may be provided for groups of solar cells of the solar module. FIG. 3 depicts in an embodiment of a solar module in which reinforcements 28' are provided for the solar cells 18 on a per column basis. For the purposes of this disclosure, the solar cells which are aligned horizontally in FIG. 3 are considered as being in a column. As can be seen in FIG. 3, a single reinforcement 28' extends across each of the solar cells 18 in the upper column, and a single reinforcement 28' extends across each solar cell 18 in the lower column. In other embodiments, solar cells may be grouped in other ways for reinforcement. For example, solar cells may be grouped into subarrays (not shown), e.g., 2×2, 3×3, 2×3 and the like, with appropriately sized and shaped glass or plastic plates being provided for reinforcements of the subarrays.

A solar module having reinforced solar cells does not require a rigid support frame that is typically required of solar modules which are more susceptible to bending-induced damage to the solar cells. As a result, the solar module 10 of FIGS. 1 and 2 may comprise a frameless solar module. The electronic connection interface 24 and any electronic devices, such as DC/AC micro inverters, DC/DC converters, DC/DC optimizers, battery storage devices, and the like, may be incorporated into the laminate structure, e.g., between the front side and back side cover layers 14, 16 and in the open spaces 22 between cells, or fixed to an outer surface of a cover layer, e.g., using an adhesive.

Figure 4:
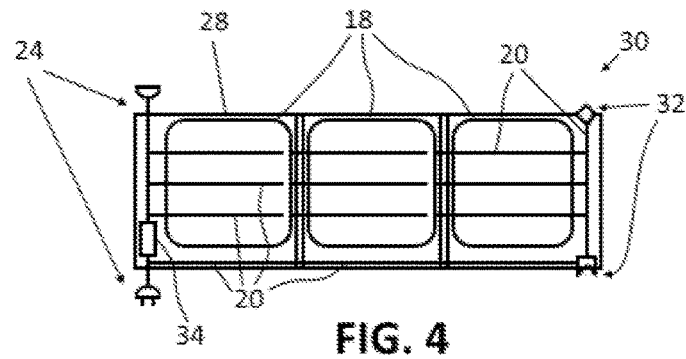
FIG. 4 depicts a solar module unit comprising three individually reinforced solar cells arranged in a single column.

The use of individually reinforced solar cells or reinforced groups of solar cells also enables solar modules to be provided in a variety of different sizes and shapes. Smaller size modules, or units, in particular, can be used as building blocks to provide solar energy solutions that would not otherwise be possible with traditional solar modules. FIG. 4 depicts an embodiment of a solar module unit 30. The solar module unit 30 of FIG. 4 includes three solar cells 18. In other embodiments, more (e.g., four) or fewer (e.g., two) cells could be used. Each of the solar cells 18 of the solar module unit 30 is provided with a reinforcement 28.

Figure 6:
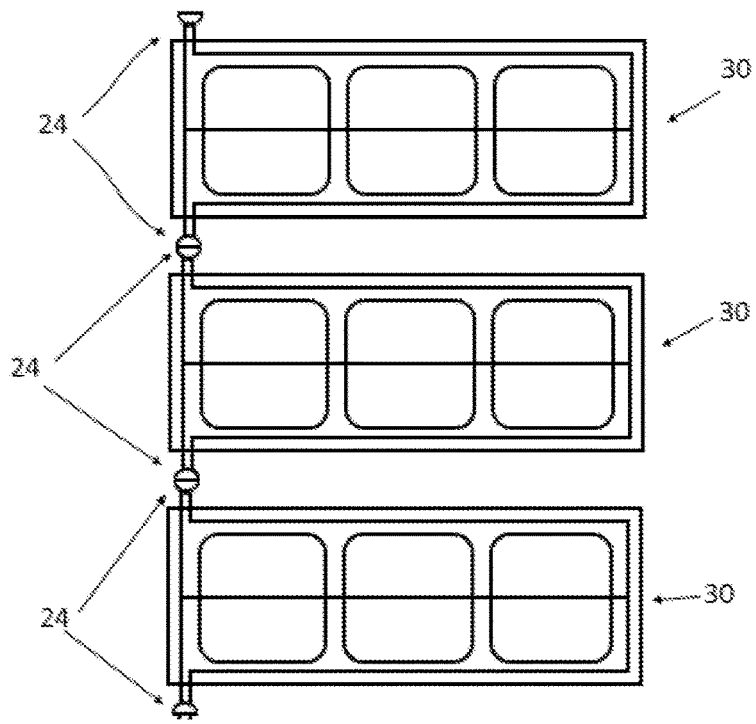
FIG. 6 shows a plurality of solar module units, such as depicted in FIG. 4, connected in parallel.
Figure 7:
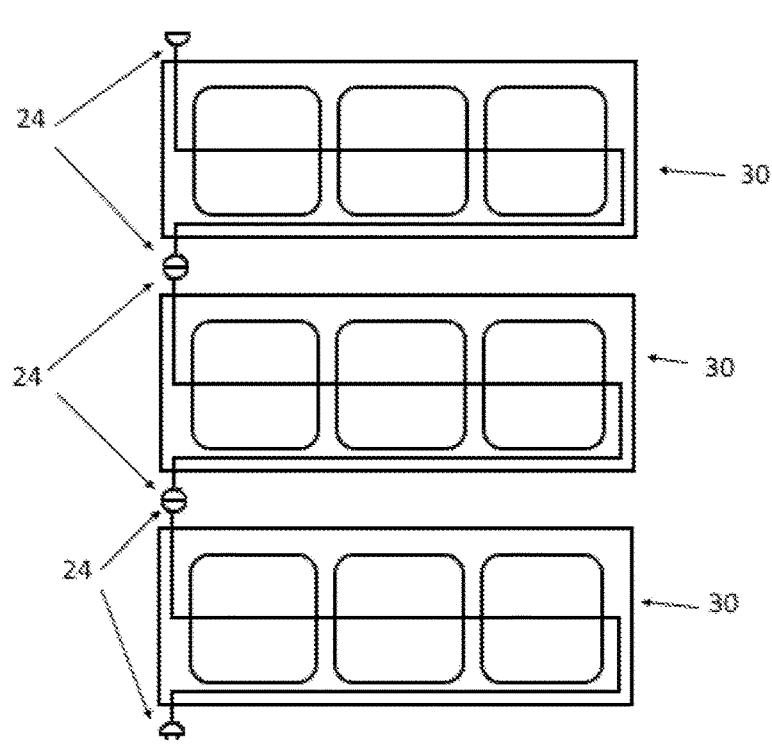
FIG. 7 shows a plurality of solar module units, such as depicted in FIG. 4, connected in series.

The solar module unit 30 of FIG. 4 includes an electrical connection interface 24 that enables the solar module unit 30 to be connected to other solar module units, other solar modules, and external electrical systems as needed. The electrical connection interface 24 may be configured to enable solar module units to be electrically connected in any suitable manner. For example, the electrical connection interface may be configured to enable the solar module units 30 to be connected in parallel as depicted in FIG. 6 or in series as depicted in FIG. 7. When units 30 are connected in parallel as depicted in FIG. 6, the DC current output by the assembly is proportional to the number of units that are connected in parallel whereas the AC voltage output stays the same regardless of the number of units connected in parallel. Conversely, for series connected units, such as depicted in FIG. 7, the AC voltage output of the assembly is proportional to the number of units connected in series whereas the DC current output by the assembly stays the same regardless of the number of units connected in parallel.

Figure 5:
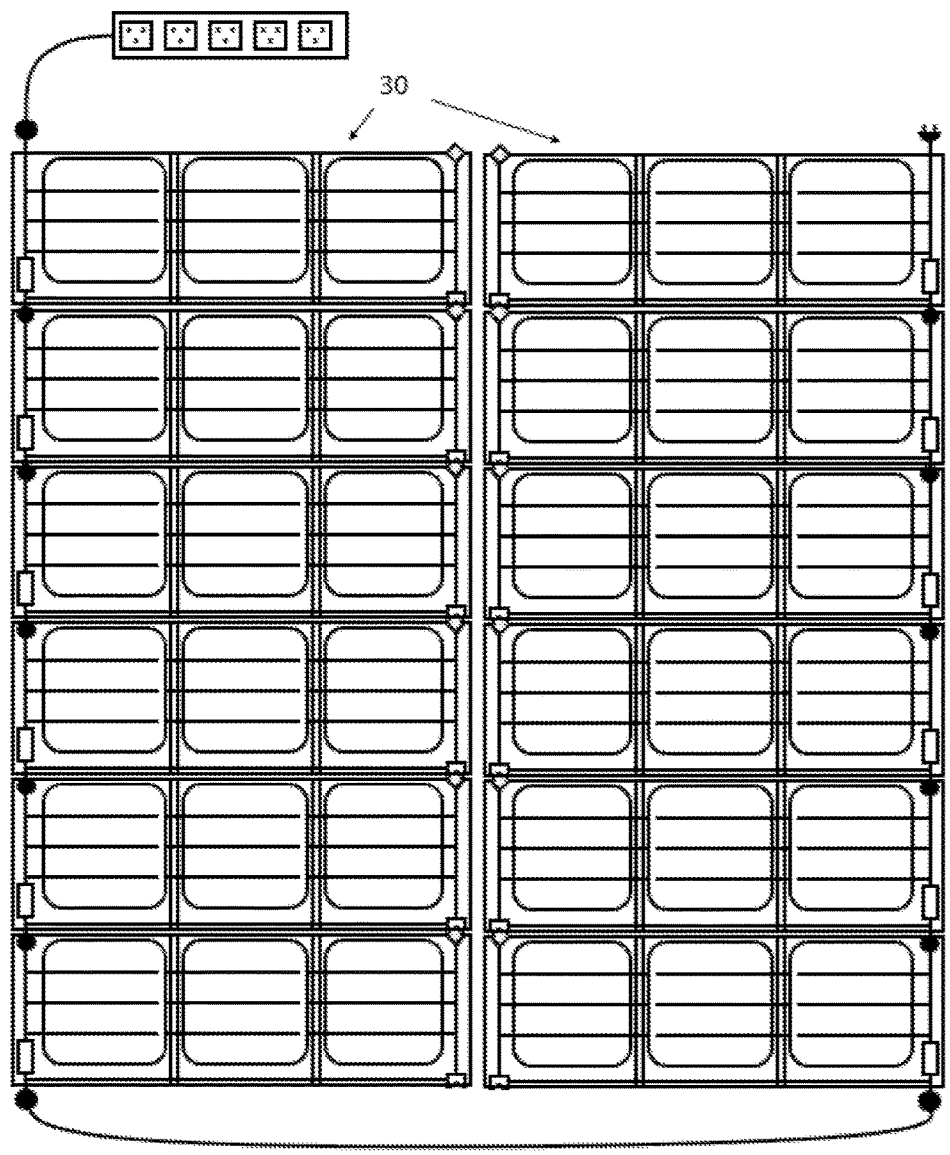
FIG. 5 depicts a plurality of solar modules units, such as depicted in FIG. 4, arranged to form a solar module, such as depicted in FIG. 1.

Referring again to FIG. 4, the solar module unit 30 also includes module attachment features 32 that enable solar module units to be attached to each other to form effectively larger arrays of solar cells. Any suitable type of attachment features 32 may be used. In one embodiment, the modules are provided with complementary latching features that enable the solar module 30 to be attached to each other in rows such as depicted in FIG. 5.

Because the solar module unit 30 is frameless, the electrical connection interface 24 and attachment features 32 may be integrated into the laminate structure, e.g., between the front side and back side cover layers. Electronic devices, such as DC/AC micro inverters, DC/DC converters, DC/DC optimizers, energy storage devices (e.g., batteries) and the like, may be incorporated into the solar module unit. As depicted in FIG. 4, an electronic device 34 is incorporated into the solar module unit 30. In one embodiment, the electronic device 34 comprises a micro inverter although suitable type and number of devices could be used. The electronic device 34 may be incorporated into the laminate structure. In alternative embodiments, the electronic device 34 may be adhered to an outer surface of the back side cover layer.

Figure 8:
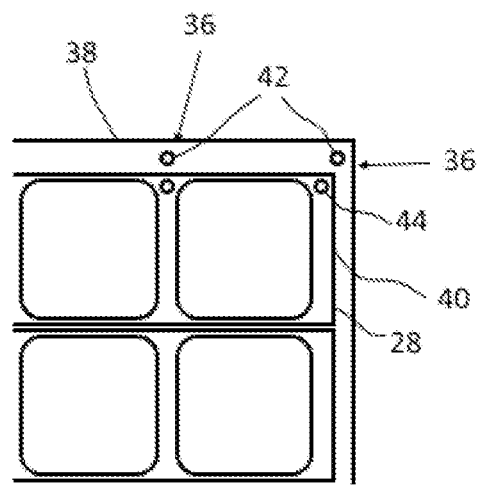
FIG. 8 is a fragmentary view of a solar module, such as depicted in FIG. 2, showing openings for the anchor points of the mounting system in the peripheral region of the laminate structure of the solar module.
Figure 9:
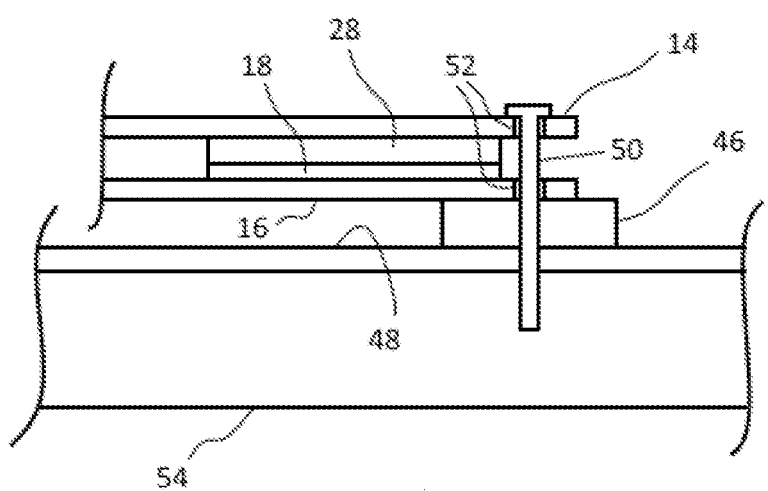
FIG. 9 is a schematic depiction of the mounting system of a solar module, such as depicted in FIG. 1, showing a stand off arranged between the solar module and a mounting surface.

Because the solar modules 30 described herein are frameless, a mounting system for mounting solar modules to a mounting surface, such as a roof, and/or to other solar modules, is incorporated into the laminate structure. The mounting system comprises one or more anchor points 36 the define positions at which the solar module may be contacted and exposed to mechanical stresses to secure the module to a mounting surface. In one embodiment, the anchor points 36 are located in the peripheral region 38 of the solar module outside of the regions where the solar cells are located. Openings 42 are provided in the peripheral regions at the anchor points 36 as depicted in FIGS. 8 and 9. Any suitable number and positioning of openings 42 may be used. For example, openings 42 may be provided in the peripheral regions 38 of the front side and back side covers 14, 16 in the corner(s) and/or along the edges between the corners as depicted in FIG. 8. The openings 42 used in the mounting system of FIG. 9 extend through the peripheral region of the covers while avoiding the solar cell laminate. In alternative embodiments, openings 44 may be provided in peripheral regions 40 of the reinforcements 28 as depicted in FIG. 8.

Figure 10:
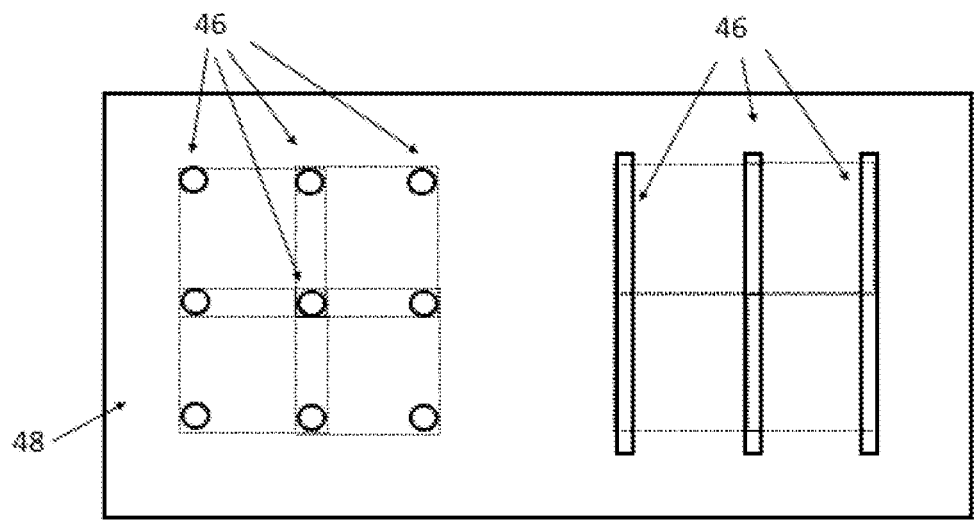
FIG. 10 depicts an arrangement of stand offs in the form of pucks and an arrangement of stand offs in the form of rails.

As depicted in FIG. 9, the mounting system may comprise stand offs 46, or spacers, which are placed between the back side 16 of the solar module and the mounting surface 48 to allow air circulation between the solar module and the mounting surface. The stand offs 46 may comprise puck-shaped members, such as depicted in FIG. 7, having central openings for receiving a fastener 50, such as a screw or bolt. The screw 50 extends through the openings in the solar module and the stand off 46 and into a structural member 54, such as a rafter or beam, at the installation site. To facilitate the use of fasteners, the peripheral region of the laminate may be provided with grommets 52 that define the openings for the fasteners and which can protect the plastic or glass material around the openings. Referring to FIG. 10, multiple stand offs 46 may be used to mount a plurality of solar modules to a mounting surface 48. As depicted in FIG. 10, rails or beams could be used as an alternative to pucks or blocks as standoffs.

Figure 11:
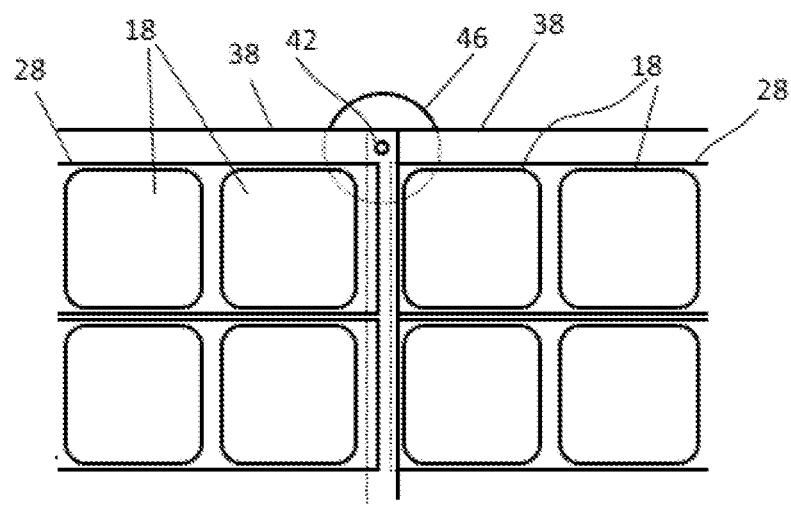
FIG. 11 depicts adjacent solar modules secured to each other by aligning openings located in the peripheral edge of the laminate structures of both solar modules and extending a fastener through the aligned openings.

The openings in the peripheral edges of the solar modules may be used to secure adjacent solar modules to each other and to a mounting surface. As depicted in FIG. 11, the openings 42 in the peripheral regions 38 of adjacent modules may be aligned so that a single fastener can be extended through both laminates to secure the solar modules to a mounting surface. As can be seen in FIG. 11, a single stand off 46 can be used to support multiple solar modules.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A solar module comprising:
   a laminate structure including:
   an active layer having at least two solar cells, each of the solar cells having a first face and a second face and including a separate reinforcement laminated to the first face; and
   a cover layer attached to at least one of (i) an outer face of each of the reinforcements and (ii) a second face of each of the solar cells; and
   a module interconnection interface for electrically connecting the solar module to another solar module, the module interconnection interface comprising at least two terminal interconnections, wherein
   the solar cells are spaced apart from each other and the reinforcements are spaced apart from each other such that a gap is defined between each of the solar cells, and
   the solar cells are electrically connected to each other by flexible wiring conductors that extend through the gap.

2. The solar module according to claim 1, wherein the separate reinforcements are each made of a hard plastic material.

3. The solar module according to claim 1, wherein the separate reinforcements are each made of glass.

4. The solar module according to claim 1, wherein the first face of the solar cells comprises a back face of the solar cells.

5. The solar module according to claim 1, wherein the flexible conductors comprise ribbon-type conductors or multi-wire conductors.

6. The solar module according to claim 1, wherein the solar module is a frameless module.

7. A solar module comprising:
   a laminate structure including:
   an active layer having at least two solar cells, each of the solar cells having a first face and a second face and including a separate reinforcement laminated to the first face; and
   a cover layer attached to at least one of (i) an outer face of each of the reinforcements and (ii) a second face of each of the solar cells, wherein
   the solar cells are spaced apart from each other and the reinforcements are spaced apart from each other such that a gap is defined between each of the solar cells, and
   the solar cells are electrically connected to each other by flexible wiring conductors that extend through the gap;

a mounting system for mounting the solar module to a mounting surface, wherein
the mounting system includes one or more stand offs that are configured to be placed between the solar module and the mounting surface, and
the laminate structure includes one or more anchor points at which the laminate structure is supported on the one or more stand offs.

8. A solar module comprising:
a laminate structure including:
   an active layer having at least two solar cells, each of the solar cells having a first face and a second face and including a separate reinforcement laminated to the first face; and
   a cover layer attached to at least one of (i) an outer face of each of the reinforcements and (ii) a second face of each of the solar cells, wherein
the solar cells are spaced apart from each other and the reinforcements are spaced apart from each other such that a gap is defined between each of the solar cells,
the solar cells are electrically connected to each other by flexible wiring conductors that extend through the gap,
the laminate structure includes a peripheral region, the peripheral region including one or more anchor points, and
the anchor points of the peripheral region are secured to a mounting surface using at least one of nails, screws, staples, and adhesive.

9. The solar module according to claim 1, wherein the cover layer is formed of glass or plastic, and
   wherein the cover layer includes a peripheral region located outside of the solar cells,
   wherein the peripheral region defines one or more openings for receiving fasteners for securing the solar module to a mounting surface, and
   wherein the one or more openings are defined by grommets integrated into the cover layer in the peripheral region.

10. The solar module according to claim 1, further comprising at least one electronic device, the at least one electronic device comprising at least one of a DC/AC micro inverter, a DC/DC converter, and a DC/DC optimizer,
   wherein the at least one electronic device is incorporated into the laminate structure.

11. The solar module according to claim 1, further comprising at least one electronic device, the at least one electronic device comprising at least one of a DC/AC micro inverter, a DC/DC converter, and a DC/DC optimizer,
   wherein the at least one electronic device is secured to an outer face of the cover layer by an adhesive.

12. The solar module of claim 1, wherein the gap includes a filler material that limits flexing of the flexible conductors in the gap.

* * * * *